(12) United States Patent
Lan et al.

(10) Patent No.: US 7,279,709 B2
(45) Date of Patent: Oct. 9, 2007

(54) ELECTRONIC INK DISPLAY DEVICE

(75) Inventors: Wei-Chou Lan, Hsinchu (TW);
Chun-Ming Huang, Hsinchu (TW);
Ming-Sheng Chiang, Hsinchu (TW)

(73) Assignee: Prime View International Co., Ltd., Hsinchu (TW)

( * ) Notice: Subject to any disclaimer, the term of this patent is extended or adjusted under 35 U.S.C. 154(b) by 11 days.

(21) Appl. No.: 11/336,481

(22) Filed: Jan. 19, 2006

(65) Prior Publication Data

US 2007/0108445 A1 May 17, 2007

(30) Foreign Application Priority Data

Nov. 16, 2005 (TW) .............................. 94140227 A

(51) Int. Cl.
*H01J 1/62* (2006.01)
*H01J 63/04* (2006.01)

(52) U.S. Cl. .................. 257/59; 359/253; 359/265; 359/267; 359/245; 313/498; 349/122; 349/138

(58) Field of Classification Search ................ 257/59; 359/251, 252, 253, 265, 267, 245; 349/122, 349/138; 313/498
See application file for complete search history.

(56) References Cited

U.S. PATENT DOCUMENTS

| | | | |
|---|---|---|---|
| 5,408,345 A * | 4/1995 | Mitsui et al. ................. 349/42 |
| 5,500,750 A * | 3/1996 | Kanbe et al. ................. 349/42 |
| 6,287,899 B1 * | 9/2001 | Park et al. .................. 438/149 |
| 6,879,361 B2 * | 4/2005 | Moon et al. ................. 349/114 |
| 2001/0045556 A1 * | 11/2001 | Hirakata et al. .............. 257/59 |
| 2002/0036818 A1 * | 3/2002 | Kawata ...................... 359/254 |
| 2003/0011740 A1 * | 1/2003 | Tanaka et al. .............. 349/177 |
| 2003/0173890 A1 * | 9/2003 | Yamazaki et al. .......... 313/498 |
| 2005/0253991 A1 * | 11/2005 | Chang ........................ 349/147 |

* cited by examiner

*Primary Examiner*—Jerome Jackson
*Assistant Examiner*—Anthony Ho
(74) *Attorney, Agent, or Firm*—Thomas, Kayden, Horstemeyer & Risley

(57) ABSTRACT

An electronic ink display device with a frontplane laminate and a TFT array substrate is provided. In the TFT array substrate, a first metal layer and a dielectric layer are disposed on a first substrate. The dielectric layer covers the first metal layer. A second metal layer is disposed on the dielectric layer. The first metal layer includes scan lines and gates, and the second metal layer includes data lines and sources/drains. The first substrate is divided into multiple pixel areas by the data lines and the scan lines. The gates and the sources/drains are disposed inside the pixel areas. A channel layer is disposed on the dielectric layer between the gates and the sources/drains. Pixel electrodes are disposed inside the pixel areas and connected to the drains. An electronic ink material layer of the frontplane laminate is disposed between a transparent electrode layer and the TFT array substrate.

20 Claims, 11 Drawing Sheets

ELECTRONIC INK DISPLAY DEVICE

CROSS-REFERENCE TO RELATED APPLICATION

This application claims the priority benefit of Taiwan application serial no. 94140227, filed on Nov. 16, 2005. All disclosure of the Taiwan application is incorporated herein by reference.

BACKGROUND OF THE INVENTION

1. Field of the Invention

The present invention generally relates to a display device. More particularly, the present invention relates to an electronic ink display device.

2. Description of Related Art

The electronic ink display device was developed in the 1970s. One of the major characteristic of the display device is incorporation of electrically charged micro-spheres with half of it being painted with white color and the other half being painted with black color. When an electric field is adjusted, the sphere will rotate top to bottom and hence display a different color. In the second generation of electronic ink display device developed in the 1990s, mini capsules have replaced the micro-spheres. Colored oil and charged white particles fill the mini capsules. The white particles can move to the top or sink to the bottom under a controlled electric field. When the white particles rise to the top (move closer to the reader), a white color is displayed. On the other hand, when the white particles sink to the bottom (away from the reader), the color of the oil is displayed.

At present, the most common electronic ink display device includes a frontplane laminate (FPL) and a thin film transistor array substrate. The frontplane laminate has a transparent electrode layer and an electronic ink material layer. The electronic ink material layer has a plurality of mini capsules (the electronic ink) and each mini capsule contain black and white color paint, and a transparent fluid. When the electric field between the pixel electrode of the thin film transistor array substrate and the transparent electrode layer changes, the paint will move up or down according to the direction of the electric field so that a black or a white color will appear in various pixels.

FIG. 1 is a schematic cross-sectional view of a part of the thin film transistor array substrate of a conventional electronic ink display device. As shown in FIG. 1, the thin film transistor array substrate 100 of a conventional electronic ink display device is fabricated by forming an indium tin oxide (ITO) layer 120 over a substrate 100. Then, a plurality of sources/drains 132/134 (only one is shown in FIG. 1) is formed over the indium tin oxide layer 120, and an ohmic contact layer 140 is formed over the source/drain 132/134. Thereafter, an etching solution is used to remove the oxide material on the substrate 100. After that, a channel layer 150 covering the ohmic contact layer 140 and a dielectric layer 160 covering the channel layer 150 are formed in sequence. Next, a plurality of gates 170 (only one is shown in FIG. 1) is formed over the dielectric layer 160. A passivation layer 180 is formed over the gates 170. Then, a resin layer 190 is formed to cover the substrate 110. Thereafter, an electrode layer 195 is formed over the resin layer 190. The electrode layer 195 is electrically connected to the indium oxide layer 120 through an opening 192 in the resin layer 190.

It should be noted that the thin film transistor array substrate 100 has a complicated structural design. Therefore, the manufacturing the thin film transistor array substrate 100 is quite time-consuming and expensive. As a result, the cost of producing the electronic ink display device also increases.

SUMMARY OF THE INVENTION

Accordingly, at least one objective of the present invention is to provide an electronic ink display device with a lower production cost.

To achieve these and other advantages and in accordance with the purpose of the invention, as embodied and broadly described herein, the invention provides an electronic ink display device. The electronic ink display device includes a thin film transistor array substrate and a frontplane laminate disposed on one side of the thin film transistor array substrate. The thin film transistor array substrate comprises a first substrate, a first metal layer, a dielectric layer, a second metal layer, a channel layer and a plurality of pixel electrodes. The first metal layer and the dielectric layer are disposed on the first substrate with the dielectric layer covering the first metal layer. The second metal layer is disposed on the dielectric layer. The first metal layer includes a plurality of scan lines and a plurality of gates electrically connected to the corresponding scan lines. The second metal layer includes a plurality of data lines and a plurality of sources/drains. The data lines and the scan lines divide the first substrate into a plurality of pixel areas. The gates and the sources/drains are disposed inside the pixel areas. The source is electrically connected to the data line. The gate and the source/drain overlap partially with each other inside the pixel areas. In addition, the channel layer is disposed over the dielectric layer between the gate and the source/drain. The pixel electrodes are disposed within the respective pixel areas and electrically connected to the respective drains. Furthermore, the frontplane laminate includes a second substrate, a transparent electrode layer disposed on the second substrate and an electronic ink material layer disposed between the transparent electrode layer and the thin film transistor array substrate.

In one embodiment of the present invention, the aforementioned thin film transistor array substrate further includes a flat layer covering the first substrate and located between the second metal layer and the pixel electrode.

In one embodiment of the present invention, the aforementioned flat layer has a plurality of first openings that exposes a portion of each drain so that the pixel electrodes can electrically connect with the drains through the first openings.

In one embodiment of the present invention, the material of the flat layer is resin.

In one embodiment of the present invention, the aforementioned thin film transistor array substrate further includes a passivation layer disposed between the second metal layer and the flat layer.

In one embodiment of the present invention, the aforementioned passivation layer has a plurality of second openings that exposes a portion of each drain, and the flat layer has a plurality of first openings that exposes the second openings. Furthermore, the pixel electrodes are electrically connected to the drains through the first openings and the second openings.

In one embodiment of the present invention, the aforementioned thin film transistor array substrate further includes an ohmic contact layer disposed between the channel layer and the sources/drains.

In one embodiment of the present invention, the aforementioned first metal layer further includes a plurality of common lines disposed in parallel to the scan lines such that a common line is disposed between every pair of neighboring scan lines.

In one embodiment of the present invention, the aforementioned second metal layer further includes a plurality of floating patterns disposed inside the respective pixel areas between the source and the drain. Each pixel area has two gates overlapping with part of the source and the drain and the floating pattern within each pixel area overlaps with a part of the gate.

In one embodiment of the present invention, the aforementioned first metal layer further includes a first peripheral circuit pattern and the second metal layer further includes a second peripheral circuit pattern having a portion overlapping with the first is peripheral circuit pattern. The dielectric layer has a plurality of third openings so that the second peripheral circuit pattern can electrically connect with the first peripheral circuit pattern through the third openings.

In one embodiment of the present invention, the aforementioned first metal layer further includes a first peripheral circuit pattern and the second metal layer further includes a second peripheral circuit pattern. Furthermore, the thin film transistor array substrate further includes an electrode layer electrically connecting the first peripheral circuit pattern and the second peripheral circuit pattern.

In one embodiment of the present invention, the aforementioned electrode layer and the pixel electrodes are comprised of the same layer.

In one embodiment of the present invention, the pixel electrodes are fabricated using a transparent conductive material or a metallic material.

Accordingly, compared with the conventional technique, the thin film transistor array substrate of the electronic ink display device, according to the present invention, can be fabricated by a simple process so that the production cost can be reduced. Consequently, the production cost of the electronic ink display device is also reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
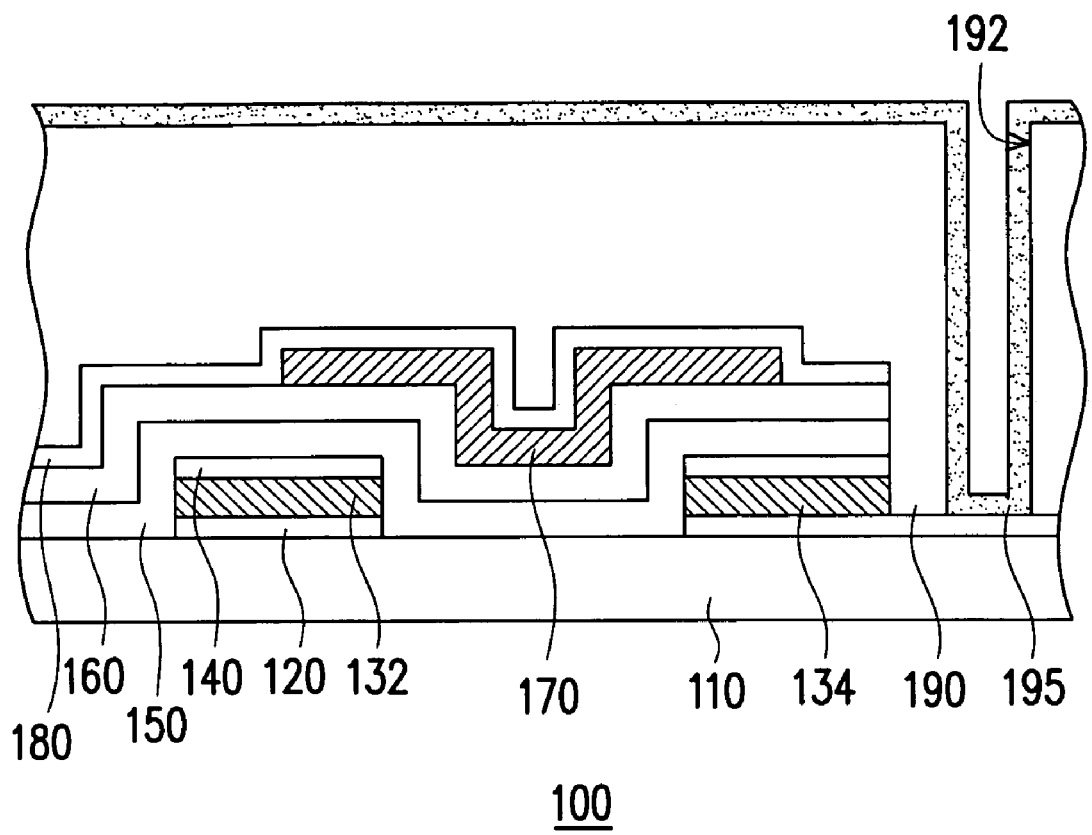
FIG. 1 is a schematic cross-sectional view of a part of the thin film transistor array substrate of a conventional electronic ink display device.

Reference will now be made in detail to the present preferred embodiments of the invention, examples of which are illustrated in the accompanying drawings. Wherever possible, the same reference numbers are used in the drawings and the description to refer to the same or like parts.

Figure 2:
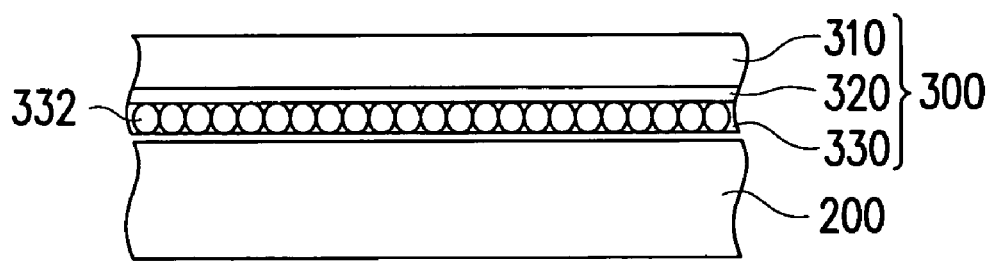
FIG. 2 is a diagram showing the structure of an electronic ink display device according to one embodiment of the present invention.
Figure 3:
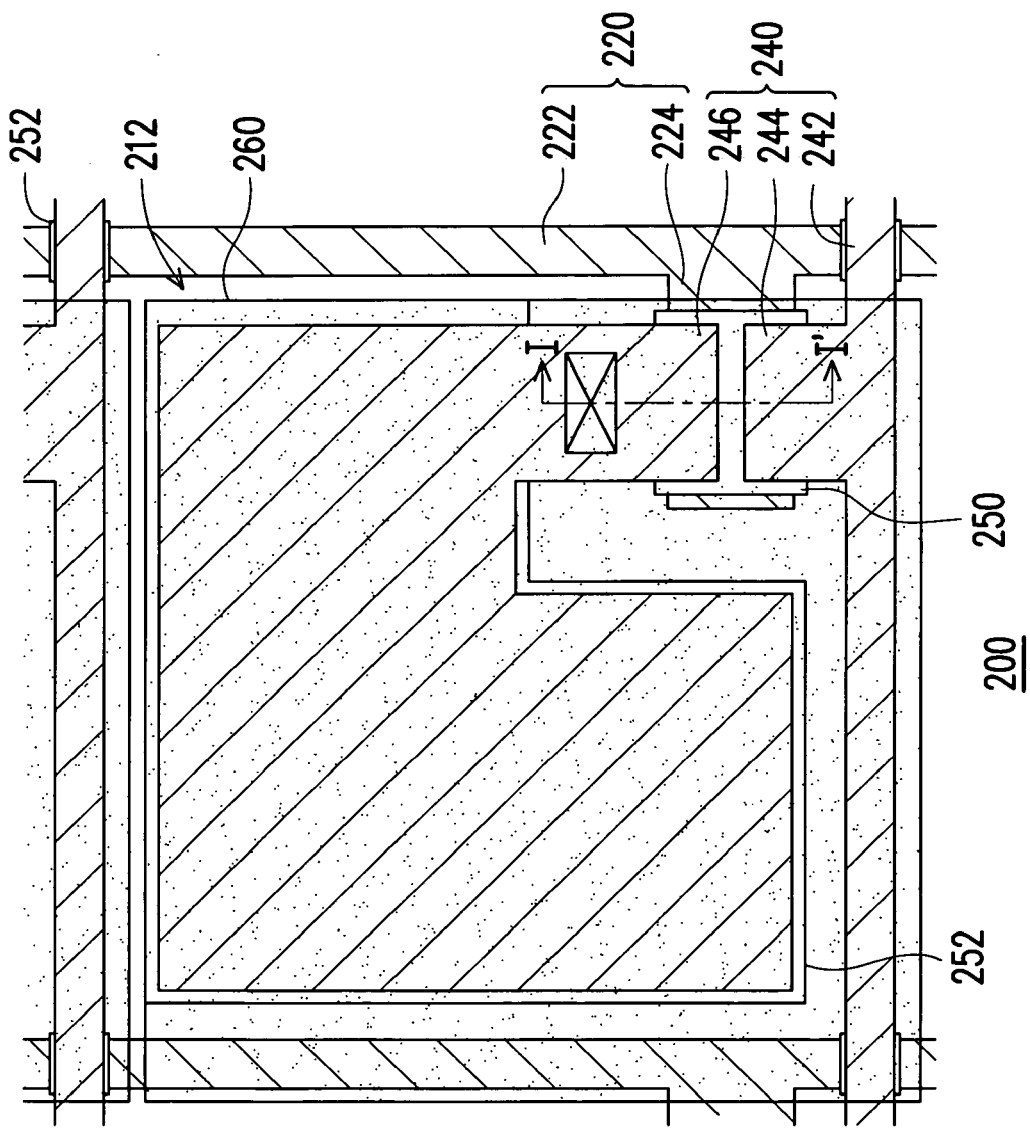
FIG. 3 is a top view of a single pixel in the thin film transistor array substrate in FIG. 2.
Figure 4:
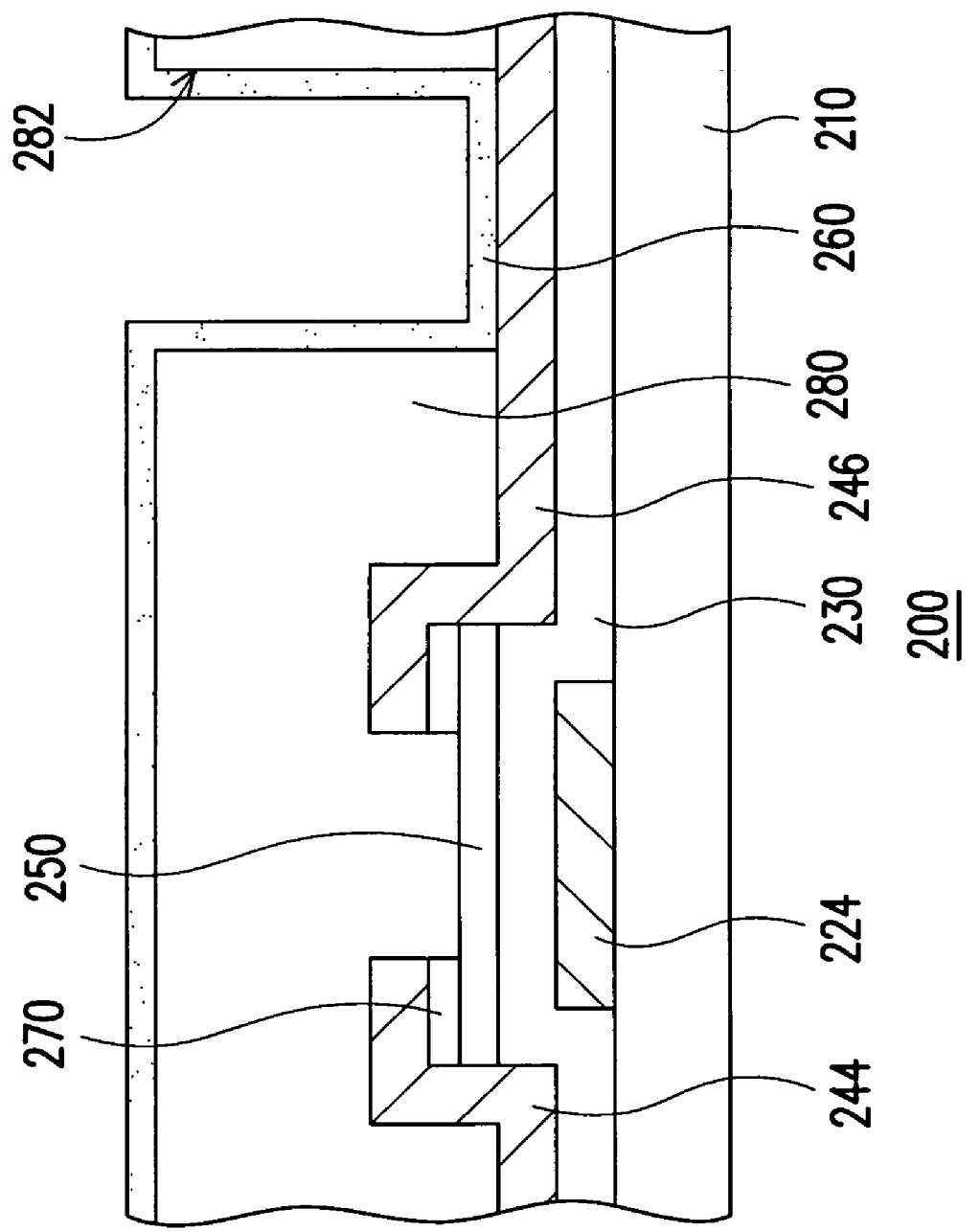
FIG. 4 is a cross-sectional view along line I-I' of FIG. 3.

FIG. 2 is a diagram showing the structure of an electronic ink display device according to one embodiment of the present invention. FIG. 3 is a top view of a single pixel in the thin film transistor array substrate in FIG. 2. FIG. 4 is a cross-sectional view along line I-I' of FIG. 3. As shown in FIGS. 2 to 4, the electronic ink display device 400 includes a thin film transistor array substrate 200 and a frontplane laminate 300 disposed on one side of the thin film transistor array substrate 200. The thin film transistor array substrate 200 comprises a first substrate 210, a first metal layer 220, a dielectric layer 230, a second metal layer 240, a channel layer 250 and a plurality of pixel electrodes 260. The first metal layer 220 and the dielectric layer 230 are disposed over the first substrate 210. The dielectric layer 230 covers the first metal layer 220 and the second metal layer 240 is disposed on the dielectric layer 230. The first metal layer 220 includes a plurality of scan lines 222 and a plurality of gates 224 electrically connected to the respective scan lines 222. The second metal layer 240 includes a plurality of data lines 242 and a plurality of sources/drains 244/246. The data lines 242 and the scan lines 222 divide the first substrate 210 into a multiple of pixel areas 212. The gates 224 and the sources/drains 244/246 are disposed inside the respective pixel areas 21. The sources 244 are electrically connected to the respective data lines 242. The source/drain 244/246 and the gate 224 inside each pixel area 212 have some overlapping region. In addition, the channel layer 250 is disposed on the dielectric layer 230 between the gates 224 and the sources/drains 244/246. The pixel electrodes 260 are disposed inside the respective pixel areas 212 and electrically connected to their respective drains 246.

The frontplane laminate 300 includes a second substrate 310, a transparent electrode layer 320 disposed on the second substrate 310, and an electronic ink material layer 330 between the transparent electrode layer 320 and the thin film transistor array substrate 200. The transparent electrode layer 320 is fabricated using indium tin oxide (ITO), indium zinc oxide. (IZO) or other transparent conductive material, for example. The electronic ink material layer 330 has a plurality of mini capsules 332 and each capsule 332 includes black paint, white paint and a transparent fluid, for example. In addition, through changing the electric field direction between the pixel electrodes 260 and the transparent electrode layer 320, the paint can move up or down according to the direction of the electric field. As a result, the various pixels in the electronic ink display device 400 display a black or a white color.

The aforementioned thin film transistor array substrate 200 further includes a plurality of pads 252 disposed underneath the drains 246 and between the scan lines 222 and the data lines 242. The pads 252 and the channel layer 250 belong to the same layer and are fabricated using amorphous silicon, for example. Furthermore, an ohmic contact layer 270 is disposed between the channel layer 250 and the sources/drains 244/246. The ohmic contact layer 270 is fabricated using n-doped amorphous silicon, for example. The pixel electrodes 260 are fabricated using a transparent conductive material or a metallic material, wherein the transparent conductive material is indium tin oxide or indium zinc oxide, for example.

The thin film transistor array substrate 200 further includes a flat layer 280 that covers the first substrate 210 disposed between the second metal layer 240 and the pixel electrodes 260. The flat layer 280 has a plurality of openings 282 disposed inside various pixel areas 212 to expose part of each drains 246. The pixel electrodes 212 are electrically connected to the respective drains 246 through the first openings 282. The flat layer 280 can be fabricated using a resin. More specifically, the flat layer 280 can be fabricated using the AZ501 material.

The method of fabricating the thin film transistor array substrate 200 in the present embodiment includes, for example, forming the first metal layer 220 over the substrate 210 and covering the first metal layer 220 with the dielectric layer 230. Next, the channel layer 250 and the ohmic contact material layer are formed over the dielectric layer 230. Thereafter, the second metal layer 240 is formed over the first substrate 210 and the ohmic contact material layer is patterned to form an ohmic contact layer 270. After that, a flat layer 280 is formed over the first substrate 210 and the pixel electrodes 260 are formed over the flat layer 280.

Compared with the conventional method of fabricating the thin film transistor array substrate 100 (as shown in FIG. 1), the thin film transistor array substrate 200 in the present embodiment requires fewer process steps. Hence, the production time can be shortened and the cost of producing the electronic ink display device 400 can be reduced. Therefore, the cost of the electronic ink display device 400 of the present embodiment can be effectively reduced.

Figure 5A:
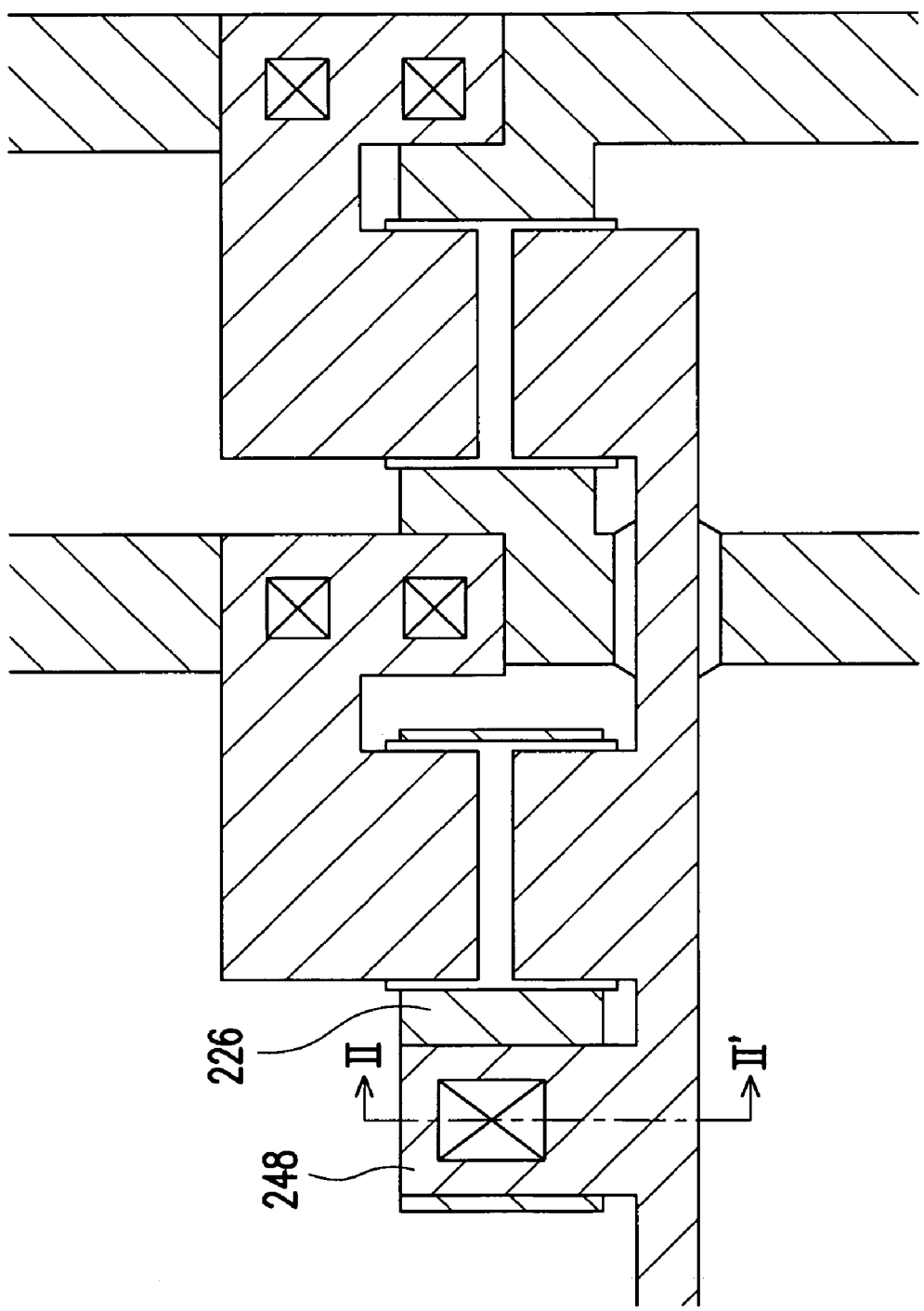
FIG. 5A is a partial top view of one type of peripheral circuit of the thin film transistor array substrate in FIG. 3.
Figure 5B:
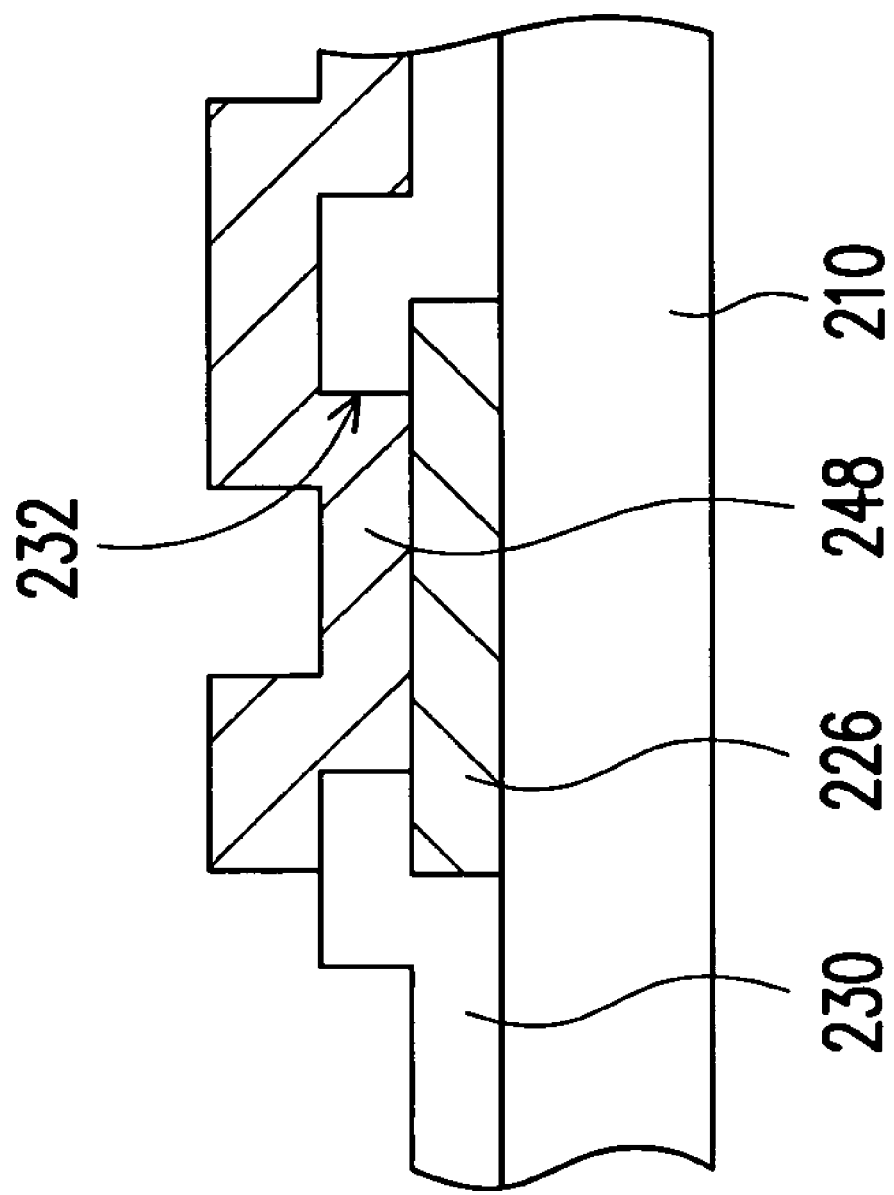
FIG. 5B is a cross-sectional view along line II-II' of FIG. 5A.

FIG. 5A is a top view of one type of peripheral circuit of the thin film transistor array substrate in FIG. 3. FIG. 5B is a cross-sectional view along line II-II' of FIG. 5A. As shown in FIGS. 5A and 5B, the first metal layer 220 further includes a first peripheral circuit pattern 226 and the second metal layer 240 further includes a second peripheral circuit pattern 248 with some overlap with the first peripheral circuit pattern 226. The first peripheral circuit pattern 226 and the second peripheral circuit pattern 248 are, for example, an electrostatic discharge protection circuit or a circuit for connecting with a chip. In addition, the dielectric layer 230 has a plurality of third openings 232 so that the second peripheral circuit pattern 248 can electrically connect with the first peripheral circuit pattern 226 through the third openings 232.

Figure 6A:
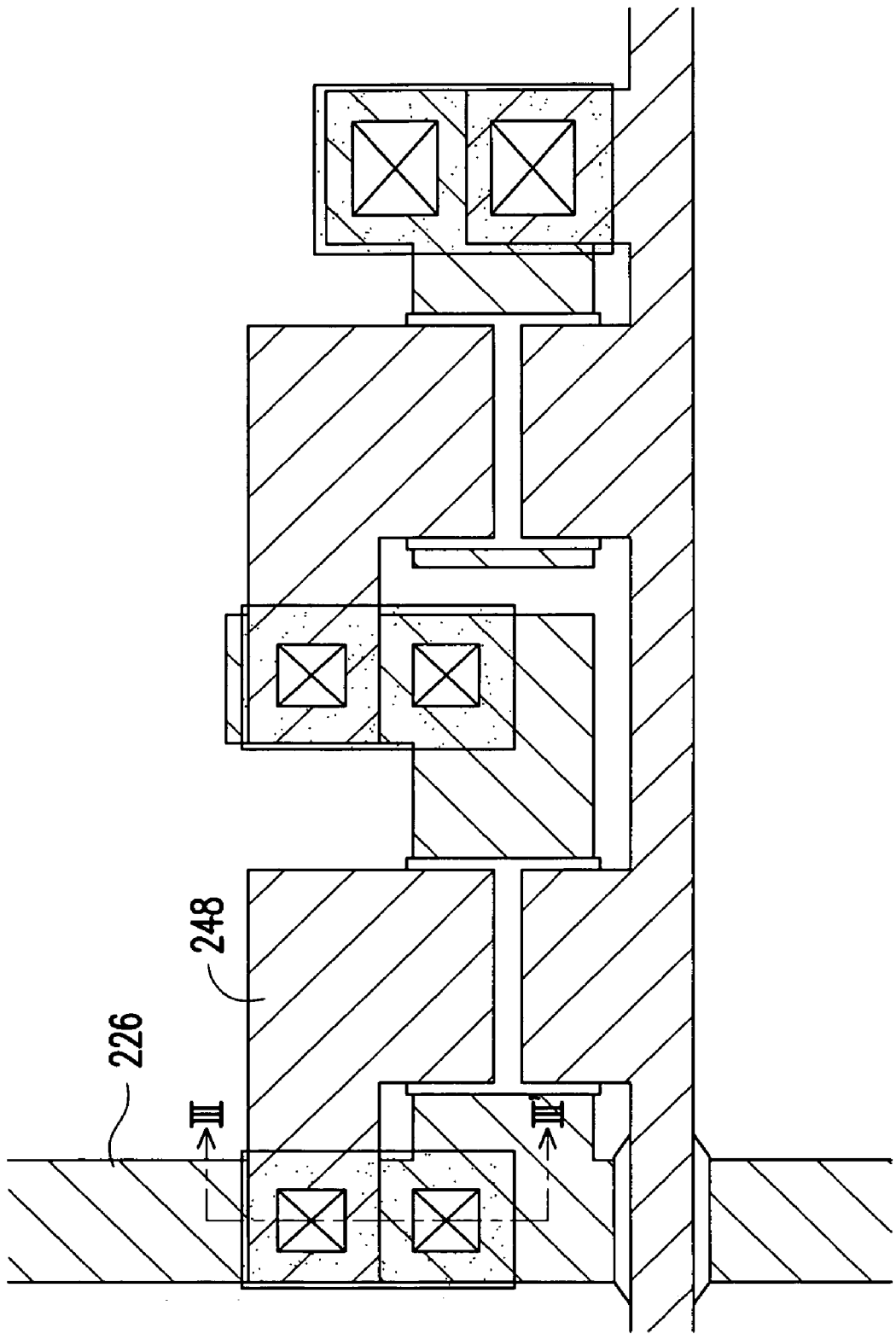
FIG. 6A is a partial top view of another type of peripheral circuit of the thin film transistor array substrate in FIG. 3.
Figure 6B:
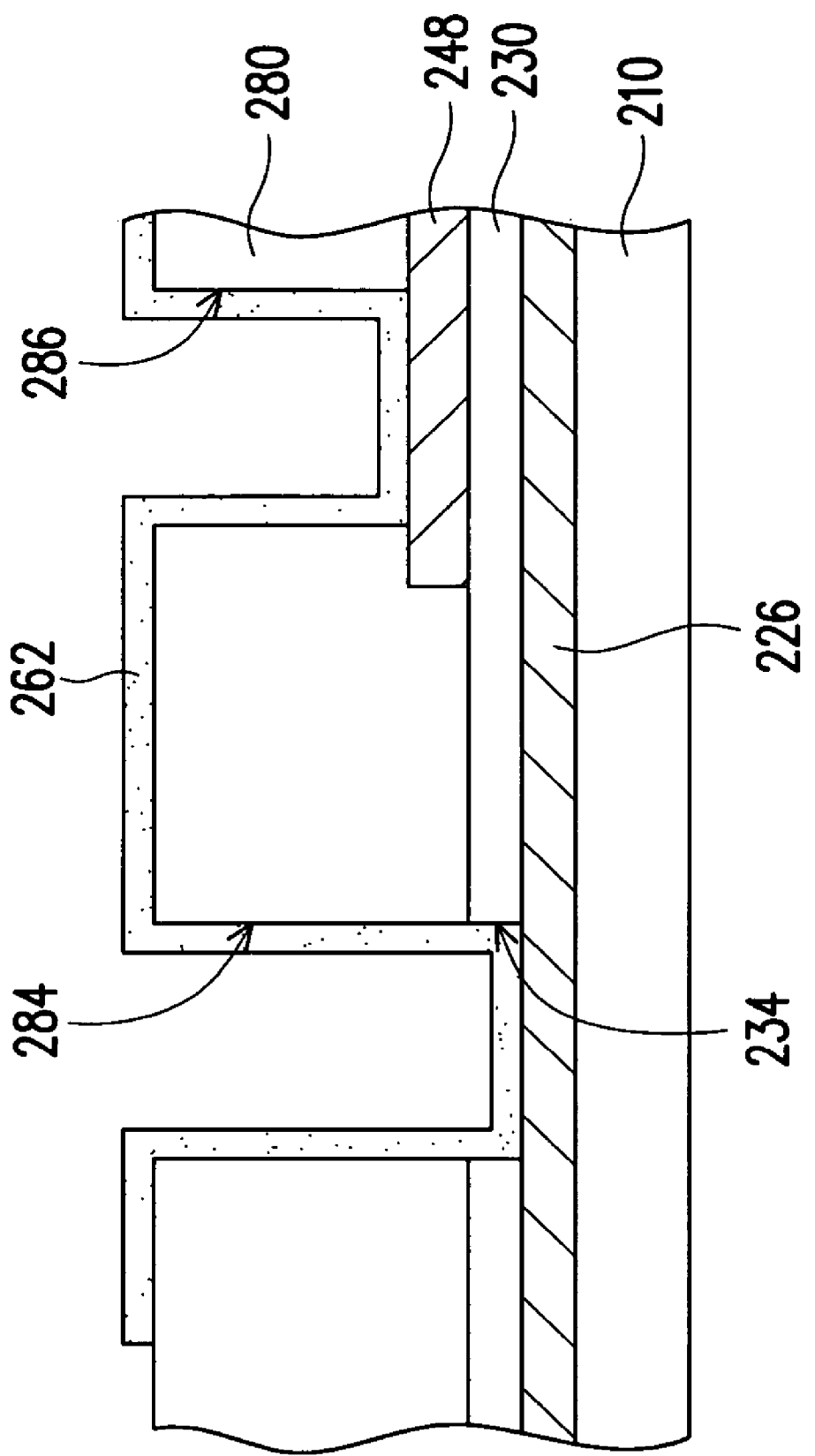
FIG. 6B is a cross-sectional view along line III-III' of FIG. 6A.

FIG. 6A is a top view of another type of peripheral circuit of the thin film transistor array substrate in FIG. 3. FIG. 6B is a cross-sectional view along line III-III' of FIG. 6A. As shown in FIGS. 6A and 6B, The first metal layer of the first peripheral circuit pattern 226 and the second metal layer 240 in the second peripheral circuit pattern 248 are electrically connected through an electrode layer 262. More specifically, the dielectric layer 230 has a plurality of fourth openings 234 that exposes a portion of the first peripheral circuit pattern 226. The flat layer 280 also has a plurality of fifth openings 284 that exposes the fourth openings 234 and a plurality of sixth openings 286 that exposes a portion of the second peripheral circuit pattern 248. Furthermore, the electrode layer 262 connects the first peripheral circuit pattern 226 and the second peripheral circuit pattern 248 through the fourth openings 234, the fifth openings 284 and the sixth openings 286. The electrode layer 262 and the pixel electrodes 260 belong to the same layer, for example.

Figure 7:
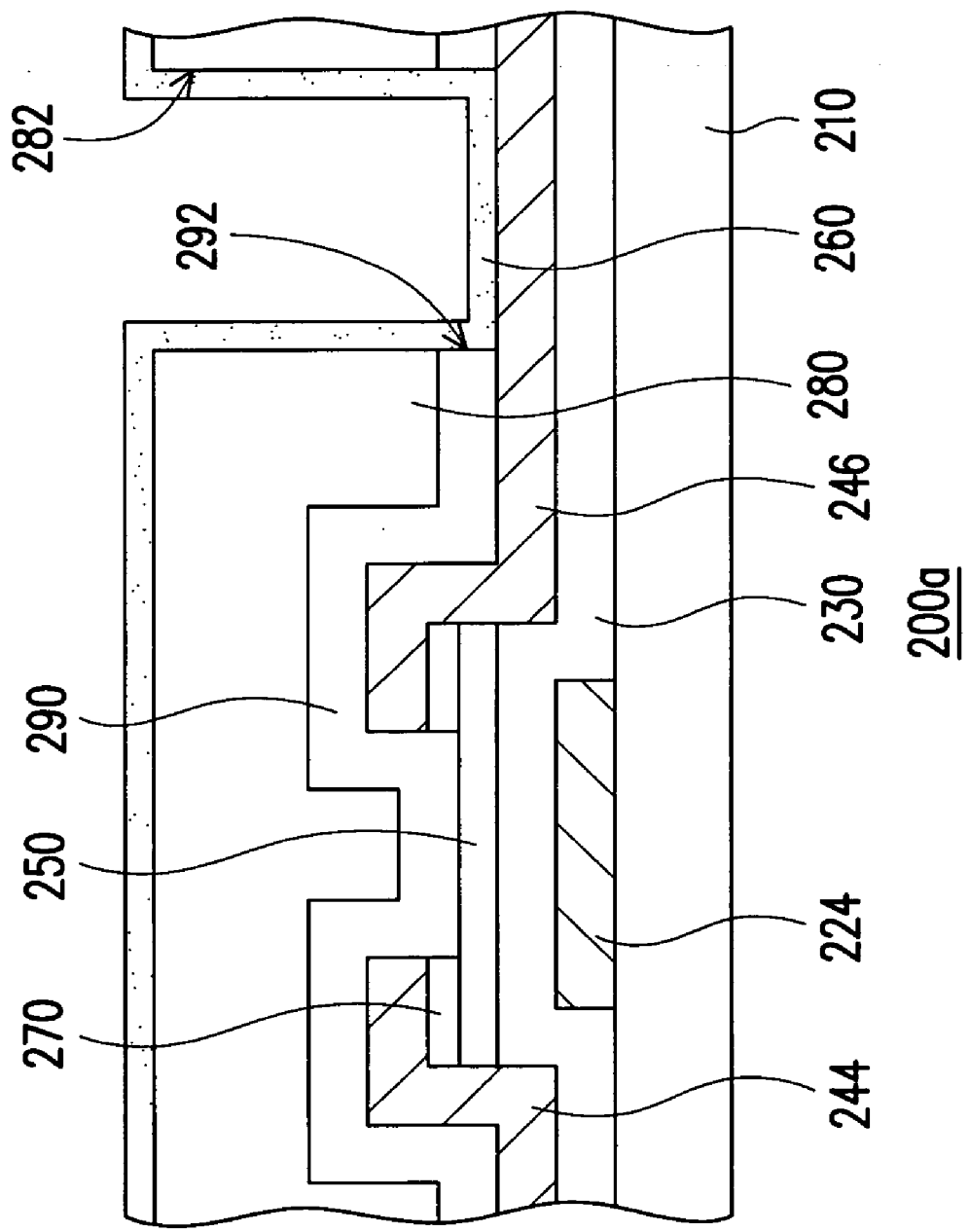
FIG. 7 is a partial cross-sectional view of a thin film transistor array substrate according to another embodiment of the present invention.

FIG. 7 is a cross-sectional view of a thin film transistor array substrate according to another embodiment of the present invention. As shown in FIG. 7, the thin film transistor array substrate 200a has a structure similar to the thin film transistor array substrate in FIG. 4 except for the thin film transistor array substrate 200a further including a passivation layer 290 disposed between the second metal layer 240 and the flat layer 280. The passivation layer 290 has a plurality of second openings 292 that are linked to the first openings 282 and the pixel electrodes 260 are electrically connected to the respective drains 246 through the first openings 282 and the second openings 292.

Figure 8:
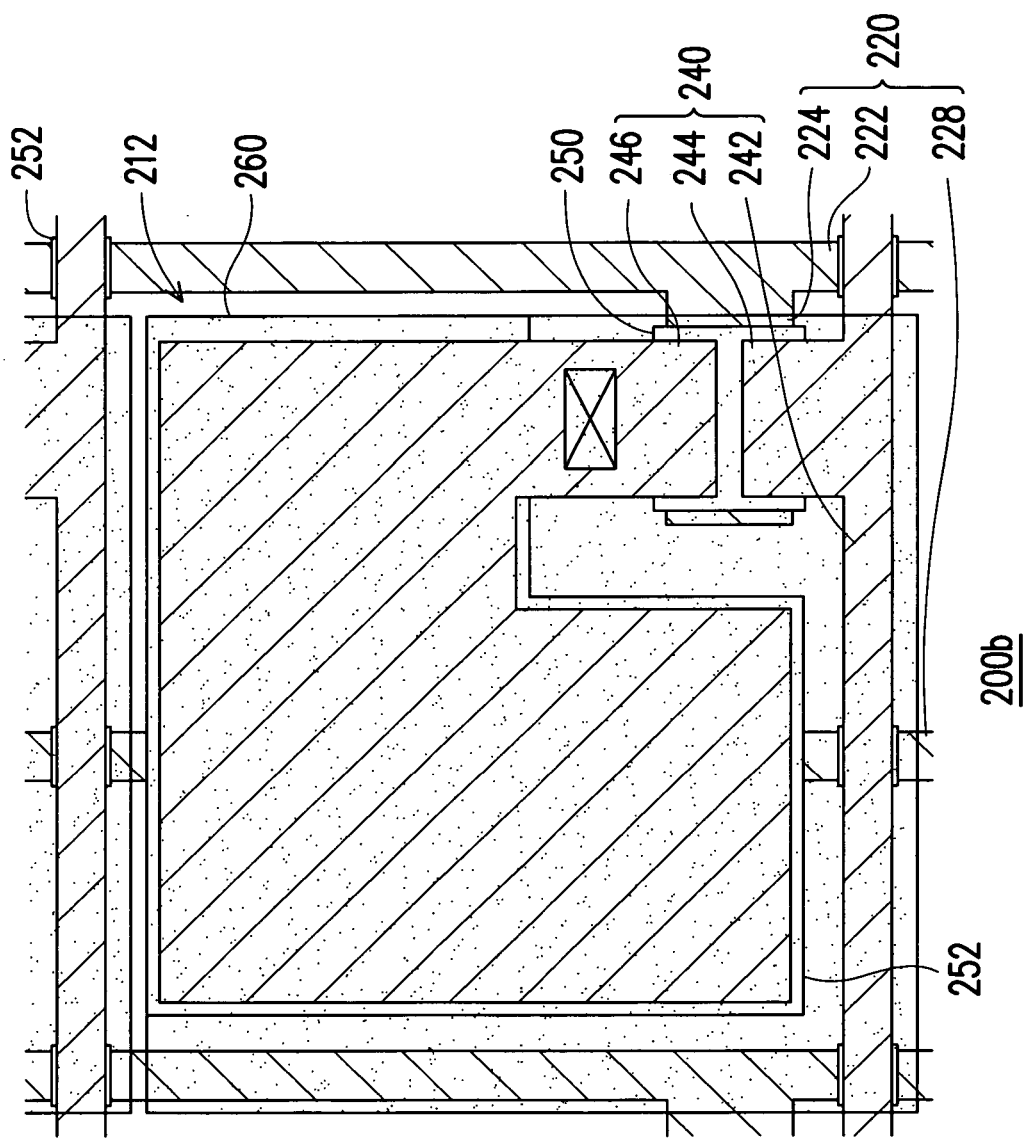
FIG. 8 is a top view showing a single pixel of a thin film transistor array substrate according to yet another embodiment of the present invention.

FIG. 8 is a top view showing a single pixel of a thin film transistor array substrate according to yet another embodiment of the present invention. As shown in FIG. 8, compared with the thin film transistor array substrate 200 in FIG. 3, the first metal layer 220 in the thin film transistor array substrate 200b of the present embodiment further includes a plurality of common lines 228 disposed in parallel to the scan lines 222. Each common line 228 is disposed between a pair of neighboring scan lines 222.

Figure 9A:
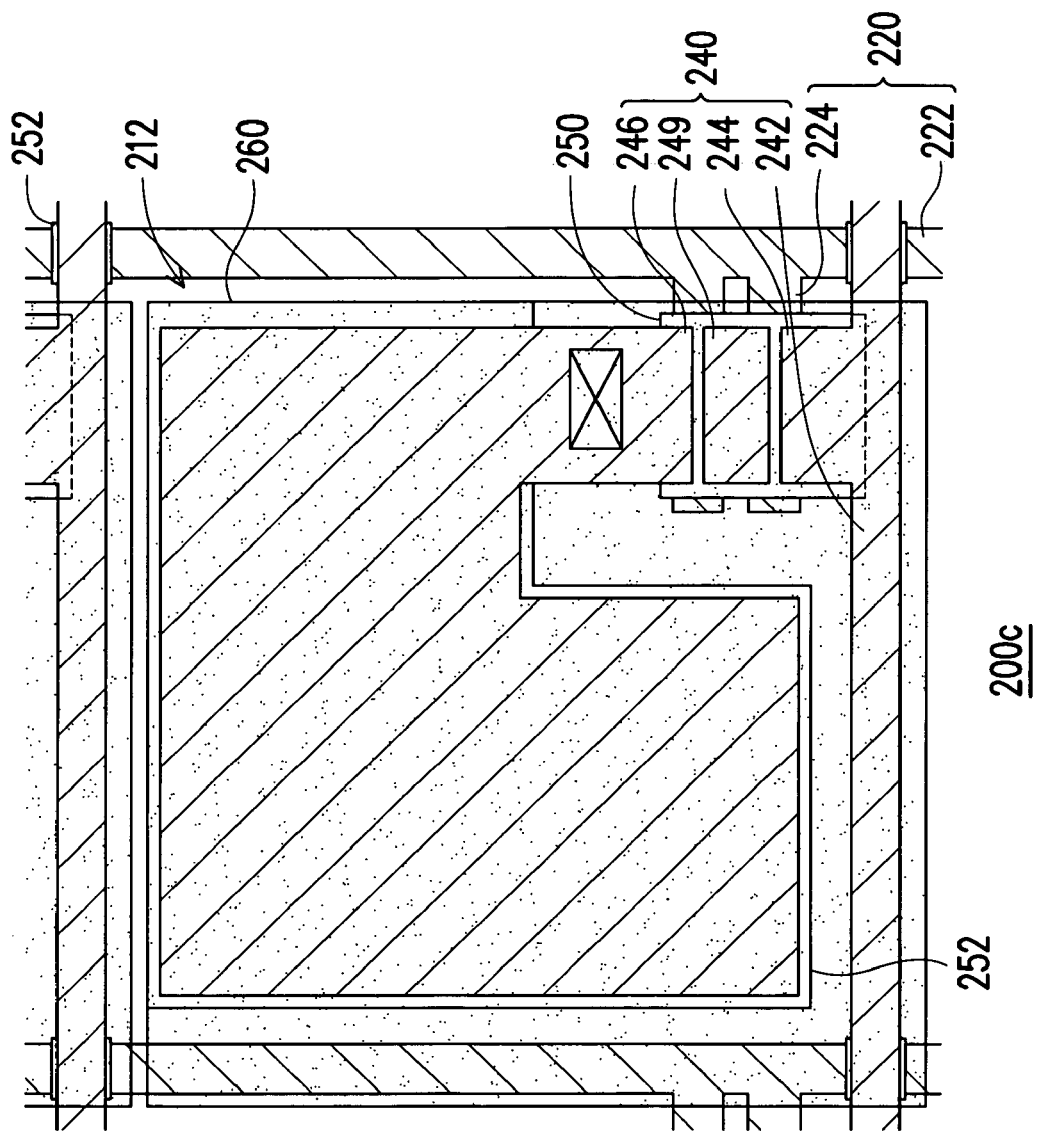
FIGS. 9A and 9B are top views showing the single pixel of two types of thin film transistor array substrates according to yet another embodiment of the present invention.
Figure 9B:
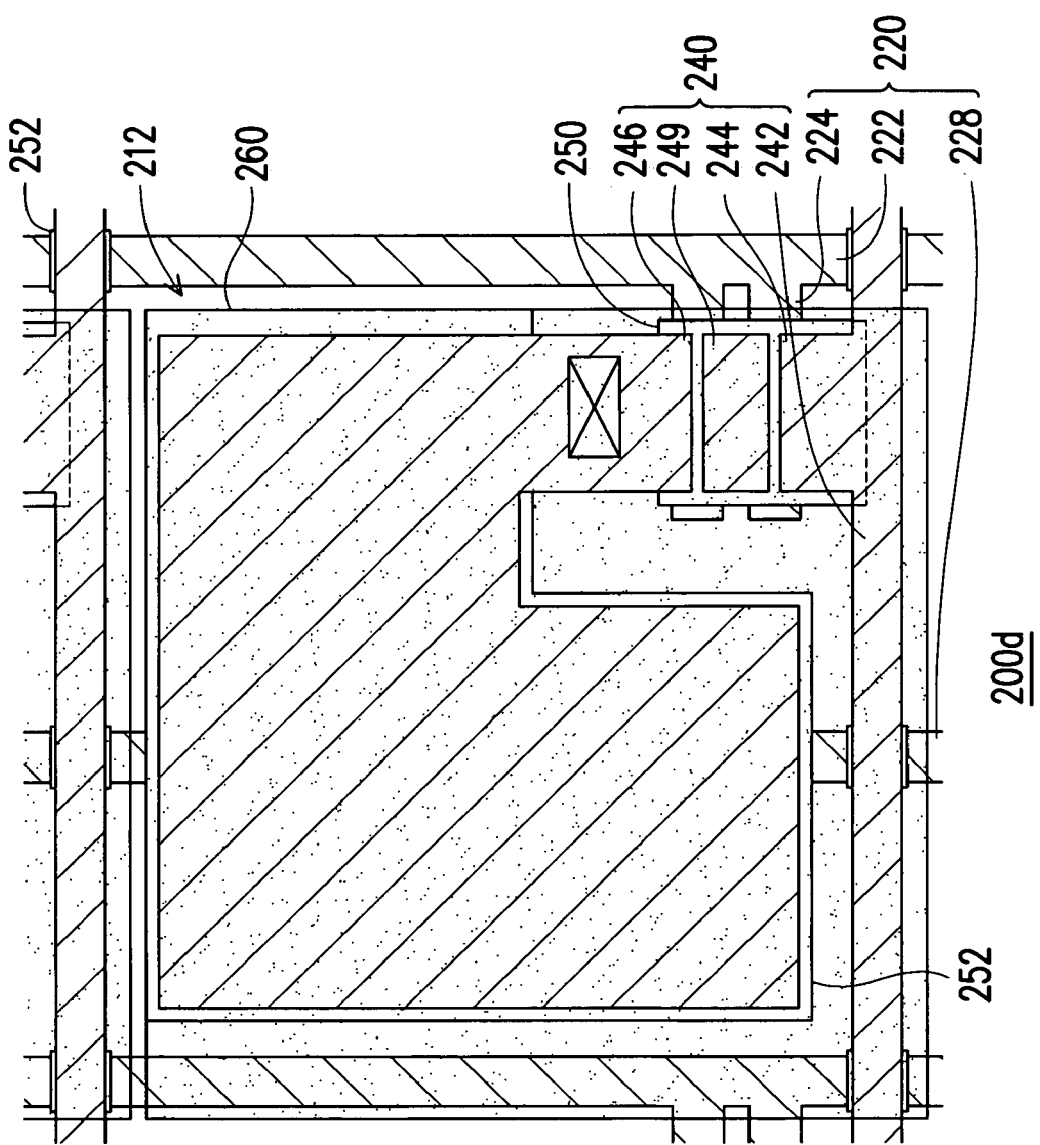

FIGS. 9A and 9B are top views showing the single pixel of two types of thin film transistor array substrates according to yet another embodiment of the present invention. As shown in FIGS. 9A and 9B, the thin film transistor array substrate 200c is very similar to the thin film transistor array substrate 200, and the thin film transistor array substrate 200d is very similar to the thin film transistor array substrate 200b. The major difference is that the second metal layer 240 in the thin film transistor array substrates 200c and 200d further include a plurality of floating patterns 249 disposed between the sources 244 and the drains 246 inside the respective pixel areas 212. In addition, two gates 224 are disposed inside each pixel area 212 such that one of the gates 224 overlaps partially with the source 244 and the other gate 224 overlaps partially with the drain 246. Furthermore, the floating pattern 249 inside each pixel area 212 also overlaps partially with the two gates 224.

In the aforementioned thin film transistor array substrates 200c and 200d, the floating pattern 249 and the source 244 inside each pixel area 212 will form a set of source/drain. Similarly, the floating gate pattern 249 and the drain 246 inside each pixel area 212 will form another set of source/drain. This two-gate structure can prevent current leakage in the thin film transistor in a shutdown operation so that the display quality of the electronic ink display device is improved.

In summary, the electronic ink display device in the present invention has at least the following advantages:

1. Compared with the conventional method of fabricating the thin film transistor array substrate of an electronic ink display device, the present invention requires fewer process steps to fabricate the thin film transistor array substrate. Hence, the production time is shortened and the production cost is lowered so that the overall production cost of the electronic ink display device can be reduced.

2. In the present invention, the two-gate structure of the thin film transistors inside the pixel areas of the thin film transistor array substrate can prevent current leakage. Hence, the display quality of the electronic ink display device is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electronic ink display device, comprising:
    a thin film transistor array substrate, comprising:
        a first substrate;
        a first metal layer, disposed over the first substrate, comprising:
            a plurality of scan lines;
            a plurality of gates electrically connected to the respective scan lines; and
            a first peripheral circuit pattern;
        a dielectric layer, disposed over the first substrate, covering the first metal layer, and including a plurality of third openings;
        a second metal layer, disposed over the dielectric layer, comprising:
            a plurality of data lines dividing the first substrate into a plurality of pixel areas together with the scan lines, wherein the gates are located within the pixel areas;
            a plurality of sources/drains, disposed inside the pixel areas such that the sources are electrically connected to the data lines, wherein the sources/drains partially overlap over the respective gates; and
            a second peripheral circuit pattern, partially overlapped with the first peripheral circuit pattern and electrically connected to the first peripheral circuit pattern through the plurality of third openings;
        a channel layer, disposed over the dielectric layer between the gates and the sources/drains;
        a plurality of pixel electrodes, disposed inside the pixel areas and electrically connected to the respective drains;
    a frontplane laminate, disposed over one side of the thin film transistor array substrate, the frontplane laminate includes:
        a second substrate;
        a transparent electrode layer, disposed over the second substrate; and
            an electronic ink material layer, disposed between the transparent electrode layer and the thin film transistor array substrate.

2. The electronic ink display device of claim 1, wherein the thin film transistor array substrate further includes a flat layer covering the first substrate and located between the second metal layer and the pixel electrodes.

3. The electronic ink display device of claim 2, wherein the flat layer has a plurality of first openings that exposes a portion of the drains such that the pixel electrodes are electrically connected to the respective drains through the first openings.

4. The electronic ink display device of claim 2, wherein the material of the flat layer is resin.

5. The electronic ink display device of claim 2, wherein the thin film transistor array substrate further includes a passivation layer disposed between the second metal layer and the flat layer.

6. The electronic ink display device of claim 5, wherein the passivation layer comprises a plurality of second openings that exposes a portion of the drains and the flat layer has a plurality of first openings that exposes the second openings such that the pixel electrodes are electrically connected to the drains through the first openings and the second openings.

7. The electronic ink display device of claim 1, wherein the thin film transistor array substrate further includes an ohmic contact layer disposed between the channel layer and the sources/drains.

8. The electronic ink display device of claim 1, wherein the first metal layer further includes a plurality of common lines disposed in parallel to the scan lines between every pair of neighboring scan lines.

9. The electronic ink display device of claim 1, wherein the second metal layer further includes a plurality of floating patterns disposed inside various pixel areas between the source and the drain, and each pixel area comprises two gates disposed therein that partially overlap with the source and the gate and the floating pattern inside the pixel area also partially overlaps with the gates.

10. The electronic ink display device of claim 1, wherein the pixel electrodes include a transparent conductive material or a metallic material.

11. An electronic ink display device, comprising:
    a thin film transistor array substrate, comprising:
        a first substrate;
        a first metal layer, disposed over the first substrate, comprising:
            a plurality of scan lines;
            a plurality of gates electrically connected to the respective scan lines; and
            a first peripheral circuit pattern;
        a dielectric layer, disposed over the first substrate, covering the first metal layer, and including a plurality of fourth openings to expose a portion of the first peripheral circuit pattern;
        a second metal layer, disposed over the dielectric layer, comprising:
            a plurality of data lines dividing the first substrate into a plurality of pixel areas together with the scan lines, wherein the gates are located within the pixel areas;
            a plurality of sources/drains, disposed inside the pixel areas such that the sources are electrically connected to the data lines, wherein the sources/drains partially overlap over the respective gates; and
            a second peripheral circuit pattern;
        a channel layer, disposed over the dielectric layer between the gates and the sources/drains;
        a plurality of pixel electrodes, disposed inside the pixel areas and electrically connected to the respective drains;
        a flat layer, covering the first substrate and located between the second metal layer and the pixel electrodes, the flat layer including a plurality of fifth openings and a plurality of sixth openings, the plurality of fifth openings exposing the plurality of fourth openings, the plurality of sixth openings exposing a portion of the second peripheral circuit pattern;
        an electrode layer connecting the first peripheral circuit pattern and the second peripheral circuit pattern through the fourth openings, the fifth openings and the sixth openings;

a frontplane laminate, disposed over one side of the thin film transistor array substrate, the frontplane laminate includes:
  a second substrate;
  a transparent electrode layer, disposed over the second substrate; and
  an electronic ink material layer, disposed between the transparent electrode layer and the thin film transistor array substrate.

12. The electronic ink display device of claim 11, wherein the flat layer has a plurality of first openings that exposes a portion of the drains such that the pixel electrodes are electrically connected to the respective drains through the first openings.

13. The electronic ink display device of claim 11, wherein the material of the flat layer is resin.

14. The electronic ink display device of claim 11, wherein the thin film transistor array substrate further includes a passivation layer disposed between the second metal layer and the flat layer.

15. The electronic ink display device of claim 14, wherein the passivation layer comprises a plurality of second openings that exposes a portion of the drains and the flat layer has a plurality of first openings that exposes the second openings such that the pixel electrodes are electrically connected to the drains through the first openings and the second openings.

16. The electronic ink display device of claim 11, wherein the thin film transistor array substrate further includes an ohmic contact layer disposed between the channel layer and the sources/drains.

17. The electronic ink display device of claim 11, wherein the first metal layer further includes a plurality of common lines disposed in parallel to the scan lines between every pair of neighboring scan lines.

18. The electronic ink display device of claim 11, wherein the second metal layer further includes a plurality of floating patterns disposed inside various pixel areas between the source and the drain, and each pixel area comprises two gates disposed therein that partially overlap with the source and the gate and the floating pattern inside the pixel area also partially overlaps with the gates.

19. The electronic ink display device of claim 11, wherein the electrode layer and the pixel electrodes are comprised of the same layer.

20. The electronic ink display device of claim 11, wherein the pixel electrodes include a transparent conductive material or a metallic material.

* * * * *